United States Patent
Ou et al.

(10) Patent No.: US 7,546,517 B2
(45) Date of Patent: Jun. 9, 2009

(54) ERROR-CORRECTING CIRCUIT FOR HIGH DENSITY MEMORY

(75) Inventors: Elaine Ou, San Gabriel, CA (US); Woodward Yang, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 512 days.

(21) Appl. No.: 11/195,077

(22) Filed: Aug. 2, 2005

(65) Prior Publication Data

US 2006/0031741 A1    Feb. 9, 2006

Related U.S. Application Data

(60) Provisional application No. 60/598,392, filed on Aug. 3, 2004.

(51) Int. Cl.
*H03M 13/00* (2006.01)
(52) U.S. Cl. .................. 714/777; 714/785; 714/775
(58) Field of Classification Search .............. 714/777, 714/775, 785
See application file for complete search history.

(56) References Cited

U.S. PATENT DOCUMENTS

| | | | | |
|---|---|---|---|---|
| 4,032,904 | A * | 6/1977 | Anderson et al. | 365/222 |
| 4,685,089 | A * | 8/1987 | Patel et al. | 365/189.15 |
| 4,710,812 | A * | 12/1987 | Murakami et al. | 375/240.13 |
| 5,206,864 | A * | 4/1993 | McConnell | 714/755 |
| 6,239,843 | B1 * | 5/2001 | Gaudreau | 348/465 |
| 6,543,029 | B1 * | 4/2003 | Sandorfi | 714/801 |
| 6,949,954 | B2 * | 9/2005 | Nystrom et al. | 326/93 |
| 2002/0157044 | A1 * | 10/2002 | Byrd | 714/703 |
| 2003/0139923 | A1 * | 7/2003 | Wang et al. | 704/219 |

OTHER PUBLICATIONS

Sutherland et. al., GasP: A Minimal FIFO Control, 2001, IEEE, pp. 46-53.*
S. Aritome et al., "Reliability Issues of Flash Memory Cells," Proceedings of the IEEE, vol. 81, No. 5, May 1993.
I. Sutherland and S. Fairbanks, "GasP: Minimal FIFO Control," Asynchronous Circuits and Systems, 2001.
S. Haddad et al., "Degredations Due to Hole Trapping in Flash Memory Cells," IEEE Electron Device Letters, vol. 10, No. 3, Mar. 1989.
Rossi et al., "A Fast and Compact Error Correcting Scheme for Reliable Multilevel Flash Memories," IEEE International Workshop on Memory technology, Design and Testing, 2002.

(Continued)

*Primary Examiner*—M. Mujtaba K Chaudry
(74) *Attorney, Agent, or Firm*—24IP Law Group; Timothy R. DeWitt

(57) ABSTRACT

This invention relates to a circuit technique for rapidly and efficiently correcting for read and write data errors in a digital semiconductor memory. More generally, this can also be in any type of digital memory or digital communication channel. As semiconductor memories get smaller and smaller, the memory cells are subject to higher rates of manufacturing defects and soft errors. Correction of manufacturing defects is achieved through extensive testing and use of redundant memory cells to replace defective memory cells. Soft errors are very difficult to detect and correct and only the simplest parity check codes have been implemented. The cost in terms of delay time and computational complexity are barriers to the implementation of ECC. This invention represents a device that introduces very little delay and requires minimal hardware complexity to implement.

15 Claims, 2 Drawing Sheets

OTHER PUBLICATIONS

Tanzawa et al., "A Compact On-Chip ECC for Low Cost Flash Memories," IEEE Journal of Solid-State Circuits, 22, 5, 1997.
Houdt et al., "Investigation of the Soft-Write Mechanism in Source-Side Injection Flash EEPROM Devices," IEEE Electron Device Letters, vol. 16, No. 5, May 1995.
G. Verma and N. Mielke, "Reliability performance of ETOX based Flash memories," Proc. IEEE IRPS, 158-166, 1988.
D. Divsalar and S. Dolinar, "Concatenation of Hamming codes and Accumulator Codes with High-Order Modulations for High-Speed Decoding," IPN Progress Report 42-156 (2004).
M. McQuilken and M. Glenewinkel, "Hamming Error Control Coding Techniques with the HC08 MCU" (1993).
T. Zhang, "Efficient VLSI Architectures for Error-correcting Coding," Thesis, Univ. of Minnesota (Jul. 2002).

* cited by examiner

ERROR-CORRECTING CIRCUIT FOR HIGH DENSITY MEMORY

CROSS-REFERENCE TO RELATED APPLICATIONS

This application claims the benefit of the filing date of U.S. Provisional Application Ser. No. 60/598,392 entitled "error-correcting circuit for high-density memory," and filed on Aug. 3, 2004 by inventors Elaine Ou and Woodward Yang.

The above cross-referenced related application is hereby incorporated by reference herein in its entirety.

STATEMENT REGARDING FEDERALLY SPONSORED RESEARCH OR DEVELOPMENT

Not applicable.

BACKGROUND OF THE INVENTION

1. Field of the Invention

The present invention relates to circuit techniques for rapidly and efficiently correcting read and write data errors in a digital semiconductor memory.

2. Brief Description of the Related Art

In very high density semiconductor memory products such as Flash memory, DRAM, or SRAM, exhaustive testing and repair procedures after fabrication are essential to ensure the proper operation of every memory location under worst possible conditions and can account for a significant portion of the total production cost.

The producers of semiconductor memory must deal with the problems of process yield, the number of devices that operate according to specifications in a given production lot. Flash memory manufacturers must deal with problems arising from cell wear-out as well. As memory cell defects are the most common Flash failure mechanism, Flash memory designers have typically attempted to increase the yield with redundancy; that is, spare rows and columns are built into the memory array and any defective elements are substituted with a redundant one. The larger the device, the more complex it is to manage the redundancy, as external registers are necessary to store the failed element addresses. Exhaustive testing under a full range of test conditions is required after fabrication to identify all of the faulty cells. The post-fabrication testing procedure alone comprises about 50% of the total production cost. Furthermore, post-fabrication testing cannot account for cells that wear out later on, as some Flash memory cells are weaker than others and have a limited lifetime.

Assuming that an un-repaired Flash memory has a defective cell probability of $10^{-6}$ for each individual cell and assuming that the errors occur independently of each other, (although that may not actually be true on a real chip), one can envision the scope of problems with un-repaired Flash memory. Given that a typical NOR Flash memory fabricated in 0.13-μm technology has a random access time of 70 ns and accesses 16 bits at a time, an un-repaired memory matrix with a fault probability of $10^{-6}$ per cell would have about $5.9 \times 10^9$ errors per month, reading continuously.

Static redundancy can correct for errors caused by post-fabrication oxide defects, but does not correct for soft errors or defective cells that arise from memory wear. One possible alternative to static redundancy that can correct for all three types of errors is the use of error-correcting codes. Applying error-correcting codes to semiconductor memory is a fairly new concept, and has not yet been widely implemented in hardware.

Because memory accesses in certain types of semiconductor memory are expected to occur in a short amount of time, fast decoding circuits are necessary in order to implement error-correcting codes. NOR Flash has access times of about 70 ns in 0.13 μm technology. The access latency of DRAM is about 50 ns, and the access latency of SRAM is about 5 ns.

A Hamming code is a linear error-correcting code that uses parity to detect errors. Hamming codes are most popular for correcting errors in main memory, because they have simple computational requirements and can be decoded using minimal circuitry. This scheme allows one bit in the word to be corrected, and it can detect double bit errors but is unable to correct events where more than one bit in the word is in error.

In "A Compact On-chip ECC for Low Cost Flash Memories," IEEE Journal of Solid-State Circuits, 22, 5 (1997), Tanzawa, et al. implemented a decoder for the (522, 512) Hamming scheme, targeted towards NAND Flash. The circuit was implemented in 0.4-μm technology and optimized for low area overhead. Data bits are processed completely in series for a decoding time that is approximately equivalent to the latency for reading 512 bits in series. The total latency for accessing 512 serial bits in NAND Flash in 0.4-μm technology is around 15 μs. Scaling the design linearly for an equivalent circuit in 0.18-μm technology would indicate an estimated latency of 6.75 μs. However, Tanzawa, et al. designed their Hamming decoder for NAND Flash, and therefore area and energy costs were weighted more heavily than access delays.

SUMMARY OF THE INVENTION

An error-correction circuit that is applicable to a class of error-correcting codes, linear error-correcting codes. A linear error-correcting code uses parity to check for errors. The Hamming code is the simplest linear error-correcting code in terms of computational requirements and parity overhead and thus was chosen as a preferred embodiment to demonstrate the feasibility of on-chip error correction for semiconductor memory.

Hamming code is actually a binary BCH (Bose-Chaudhuri-Hocquenghem). Nonbinary BCH codes can correct multiple errors, but employ complex decoding algorithms involving Chien searches to find polynomial roots. Other linear codes such as the Golay code is suitable for communication systems, but the overhead in parity bits is too high to be practical for semiconductor memory.

A preferred embodiment of the present invention is a Hamming decoder circuit using asynchronous circuit techniques. With asynchronous circuits, this decoder can be implemented in memory while introducing only a negligible decoding delay. The present invention may be used for implementing error-correcting circuits for high-speed semiconductor memory without incurring a significant amount of overhead delay.

The present invention involves the design of an error-correcting circuit as applied to high density and low latency memories, especially NOR Flash and DRAM. The invention illustrates one possible implementation of error-correcting circuits, in the form of a Hamming decoder. Clocking was accomplished with asynchronous pulse generators to ensure fast cycle times and minimal decoding delay. These circuits were designed to show that error correction can be achieved with minimal additional circuitry, system complexity, power consumption and latency.

Instead of designing the decoding circuit to be timed against the system clock, a controllable clock designed from asynchronous pulse generators was used to generate clock signals for the decoder circuits. By having a controlled clock provide the clocking for the decoder, it is possible to control and adjust the timing of the circuit as necessary for the application and to provide perfect clock gating. That is, power is not consumed by the decoding circuit for clocking purposes when the decoder is not in use.

The controllable clock was built out of three asynchronous pulse generators. Asynchronous circuits use handshaking protocols for communication signals rather than a global clock. This property allows asynchronous circuits to be timing-independent and more energy-efficient than a synchronous equivalent.

The contribution of this work is the application of asynchronous pulse generators to error-correction circuits for the purpose of creating a Hamming decoder that introduces a minimal amount of decoding delay (approximately less than 10% of the total read latency for a device, which would be approximately 7 nanoseconds for NOR Flash in 0.13 micron technology or approximately 5 nanoseconds for DRAM) while being contained in a reasonable area.

The controllable clock will not have the noise associated with a system clock. Furthermore, the entire circuit can be self-contained because the system clock will not need to be wired over to the decoder. This saves area and power overhead.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention.

Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

Figure 1:
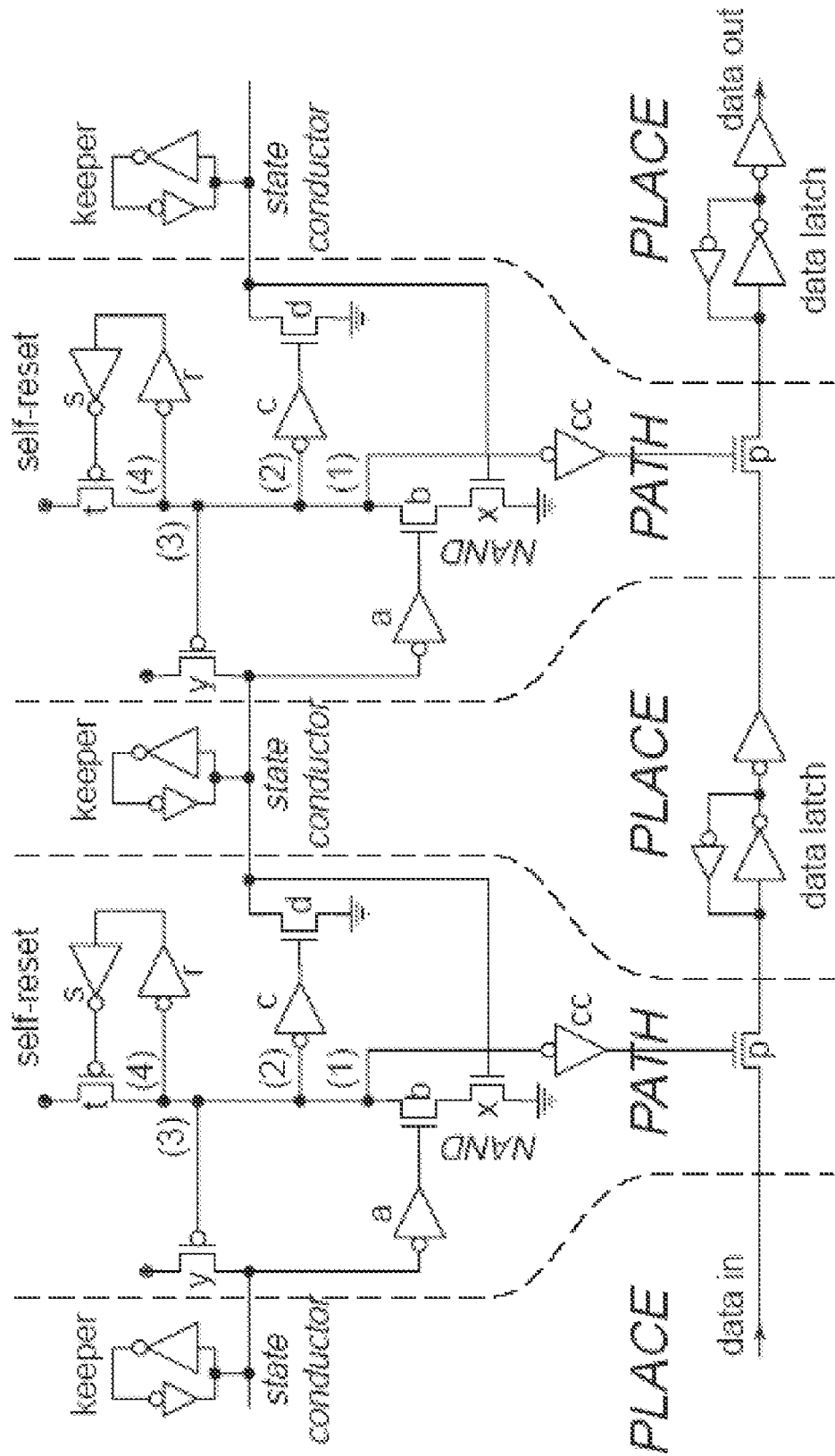
FIG. 1 is a diagram of an asynchronous GasP Pulse Generator such as may be used in a preferred embodiment of the invention.

The error-correcting scheme of the preferred embodiment of the invention was chosen based on tradeoffs between decoding speed, complexity, and error-correction rates. The error-correction of the preferred embodiment is intended to target NOR Flash memory but could be modified to be applicable to any high-speed semiconductor memory.

A (522,512) Hamming code is used in one preferred embodiment to limit the redundancy overhead to 2%. The probability of there being a fault in a 512-bit memory access is calculated as follows, where p is the probability of a single-bit error:

$$P(\text{fault}) = 1 - (1-p)^{512}$$

The probability of there being a fault in a 522-bit memory access is calculated as follows:

$$P(0 \text{ errors}) = {}_{522}C_0 * p^0 * (1-p)^{522}$$

$$P(1 \text{ error}) = {}_{522}C_1 * p^1 * (1-p)^{521}$$

Thus, implementing a (522,512) Hamming code that corrects for single-bit errors reduces the fault probability of each memory access from $5.22 \times 10^{-4}$ to $1.38 \times 10^{-10}$, if the fault probability per bit is $10^{-6}$. This is a typical error probability for defective memory cells after fabrication, before repair. Additional errors may arise as a result of environmental factors (soft errors) and eventually, cell wear-out. Further, transient errors that only shows up intermittently due to small noise margin and fluctuations in voltage, temperature or other factors are almost impossible to detect and correct and are becoming more prevalent as memory density increases and as technology becomes more advanced. These types of errors are impossible to test and repair for, and can only be addressed using ECC. The effects of implementing this error-correcting circuit are amplified as the total error probability increases.

A decoding circuit for error correction in accordance with a preferred embodiment can either read inputs directly from the sense amplifiers and send output to the I/O buffers. The encoding of data may a simple procedure involving a matrix multiplication. Structures and methods for encoding of data will be apparent to those of skill in the art and therefore are not described herein.

The error-correction circuits of a preferred embodiment were reduced to layout in the TSMC SCN018 0.18-μm CMOS process offered by MOSIS, but those of skill in the art will understand that they could be implemented for other processes, such as the 0.13-μm technology processes as well. The transistors were tuned to achieve the lowest possible latency while operating at a nominal voltage of 1.8 V. This allows the error-correction circuitry to use the Flash-chip supply voltage without needing the high-voltage charge pumps for programming and erase operations.

Instead of designing the decoding circuit to be timed against the system clock, a controllable clock designed from asynchronous pulse generators was used to generate clock signals for the decoder circuits. By having a controlled clock provide the clocking for the decoder, it is possible to control and adjust the timing of the circuit as necessary for the application and to provide perfect clock gating. That is, power is not consumed by the decoding circuit for clocking purposes when the decoder is not in use.

In a preferred embodiment, the controllable clock was built out of three asynchronous pulse generators. Asynchronous circuits use handshaking protocols for communication signals rather than a global clock. This property allows asynchronous circuits to be timing-independent and more energy-efficient than a synchronous equivalent.

Asynchronous pulse circuits are a subset of asynchronous circuit techniques using controllable timing assumptions that speed up the handshaking protocol without changing the high-level dataflow model. "GasP," such as that discussed by I. Sutherland and S. Fairbanks in "GasP: A minimal FIFO Control," *Asynchronous Circuits and Systems* (2001) ("Sutherland et al.") and by M. Nyström and A. Martin in *Asynchronous Pulse Logic*, Boston, Mass.: Kluwer Academic Publishers, (2001), is a family of asynchronous pulse circuits. A GasP pulse generator from Sutherland et al. is shown in FIG. 1. This circuit family is ideal for use in data paths because it minimizes asynchronous pipeline control. The "GasP" circuit family was designed so that each stage operates at the speed of a three-inverter ring oscillator.

The pipeline control for a latch takes 6 transitions per cycle, so in 0.13-μm technology, a single cycle could theoretically be completed in less than 150 ps (6.7 GHz).

The controlled clock generator that was used to provide timing for the decoder circuit in this paper uses three GasP pulse generators connected in a ring. The clock functions similarly to a ring oscillator, but can be turned on and off automatically as requests arrive.

Decoding a Hamming code word is a computationally simple process that consists of multiplying a code word of length k, expressed as a kx 1 matrix, with the parity check matrix, a px kmatrix where p is the number of parity bits in that particular coding scheme. The result is a px 1 matrix indicating a "syndrome". When the syndrome is a column of 0s, that indicates that the received code word has no error bits. Otherwise, the syndrome should correspond to a column in the parity check matrix. The matching column in the parity check matrix indicates which bit in the code word is in error.

Figure 2:
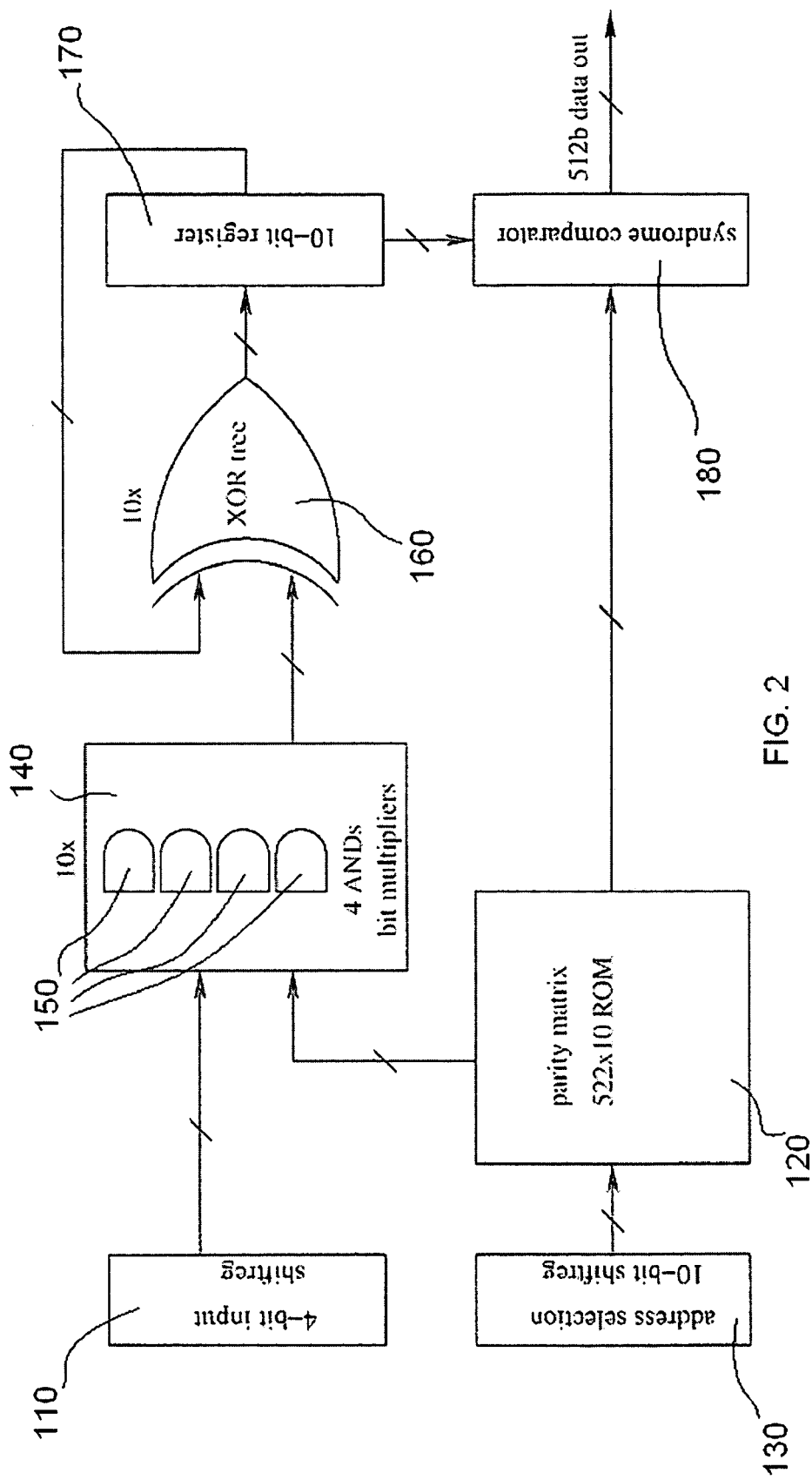
FIG. 2 is a block diagram of a Hamming decoder circuit in accordance with a preferred embodiment of the invention.

A block diagram of a decoder circuit of a preferred embodiment of the present invention is shown in FIG. 2. This circuit is designed using a shift register 110 to latch the input codeword, and a ROM 120 to store the parity check matrix. A second shift register 130 is used as an address selector for the ROM, selecting a different row in the parity check matrix on each clock pulse. The multiplier 140 is implemented as ten arrays of four AND gates 150 taking the ROM 120 output and input codeword as inputs. The AND outputs are summed as is done in a matrix multiplication. The summation is completed using ten XOR trees 160 and 10-bit shift register 170. The outputs of the XOR trees 160 comprise the syndrome, and the syndrome is compared to the columns of the parity matrix using combinational logic.

The Hamming-decoder circuit was implemented as a series of four-bit slices for simulation purposes. Timing and area tradeoffs can be adjusted by tiling different numbers of four-bit decoder slices in parallel, and taking different numbers of inputs in series. For example, tiling 32 four-bit slices would allow the decoder to take in 128 bits in four serial cycles.

Because the Hamming decoder is so simple, it is also possible to implement the entire decoding circuit in parallel and have a delay overhead of about one nanosecond, without significant area costs.

In CMOS, designers can trade off energy and delay through voltage adaptation by varying the power supply voltage Vd. Because Flash chips are intended to run on a minimal supply voltage as low as 1.5 V, we sacrificed some speed in designing the circuits so that they could still be functional at low voltages.

The transistors were tuned so that the GasP clock oscillator could generate pulse signals at a rate of 4.6 GHz while operating at 1.8 V; however, the rest of the decoding circuits could not be pipelined enough to achieve such high throughput. The GasP circuits were slowed to match a decoding cycle time of 320 ps, or 3.1 GHz. This was the maximum operating clock speed at which the decoding circuits would still function correctly at 1.5 V.

The following performance table illustrates the results of the different circuit implementations trading off area versus delay. The layout was simulated using parameters for the 0.18-μm CMOS process from TSMC via MOSIS. The following results were gathered using Caltech's Aspice circuit simulator (an efficient circuit simulator for CMOS circuits that implements Berkeley's BSIM2 and BSIM3 transistor models).

| Serial Stages | Parallel Stages | Transistors | Decoding Time (ns) |
| --- | --- | --- | --- |
| 64 | 8 | 788 | 20.48 |
| 16 | 32 | 3152 | 5.12 |
| 4 | 128 | 12608 | 1.28 |

A single four-bit slice of the Hamming decoder circuit consumes 1.57 nJ. The GasP oscillator clock consumes 4.81 nJ.

Even though the simulations presented were performed on circuits implemented in 0.18-μm technology, it is possible to use the data obtained to estimate performance results for equivalent decoder circuits implemented in other technologies.

Given that the stimulations presented were performed on circuits implemented in 0.18-μm technology, the numbers could be scaled linearly to provide estimates for equivalent decoder circuits implemented in 0.13-μm technology. For example, the 16-stage Hamming decoder could be completed in 3.70 ns instead of 5.12 ns. Scaling the performance numbers linearly only provides an estimate, but the estimate should be fairly accurate because there are no extremely long wires in the design to throw off the estimates. To first order, circuit delays decrease linearly with feature size and energy consumption decreases cubically.

The preferred embodiment described here is a high-speed Hamming decoder suitable for use in high speed semiconductor memory, such as NOR-type Flash memory or DRAM. This preferred embodiment of the invention applies asynchronous pulse generators to error-correction circuits for the purpose of creating a Hamming decoder that introduces a minimal amount of decoding delay (less than 5 ns) while being contained in a reasonable area (fewer than about 5,000 transistors).

While memory-array testing procedures cannot be eliminated altogether, they can be greatly simplified by only testing for shorted or broken rows and columns, instead of searching for bit errors. Saving testing costs can reduce production costs by up to about 50%. Memory reliability is also improved with the implementation of error-correction circuits, especially for NOR Flash, which has a typical usage lifetime of only 100,000 erase/program cycles without error correction.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An error-correction circuit for use in high speed semiconductor memory comprising:
   a hamming decoder; and
   an asynchronous pulse generator for timing said hamming decoder;
   wherein said hamming decoder comprises:
   a first shift register for latching an input code word;

a ROM for storing a parity check matrix;

an address selector for said ROM; said address selector comprising a second shift register;

a multiplier for receiving an output of said first shift register and an output of said ROM and for outputting a syndrome; and combinational logic for comparing said syndrome to columns of said parity matrix.

2. An error-correction circuit according to claim 1 wherein said multiplier comprises a plurality of arrays of AND gates.

3. An error-correction circuit according to claim 2 wherein said multiplier further comprises a plurality of XOR trees.

4. An error-correction circuit according to claim 1 wherein said asynchronous pulse generator comprises a GasP pulse generator.

5. An error-correction circuit according to claim 1 wherein said asynchronous pulse generator comprises three GasP pulse generators connected in a ring.

6. An error-correction circuit according to claim 1 wherein said semiconductor memory comprises a Flash memory.

7. An error-correction circuit according to claim 1 wherein the hamming decoder applies a binary BCH (Bose-Chaudhuri-Hocquenghem).

8. An error-correction circuit according to claim 1, wherein said hamming decoder is implemented in parallel.

9. An error-correction circuit for use in high speed semiconductor memory comprising:

a hamming decoder comprising:

a first shift register for latching an input code word;

a ROM for storing a parity check matrix;

an address selector for said ROM; said address selector comprising a second shift register;

a multiplier for receiving an output of said first shift register and an output of said ROM and for outputting a syndrome; and combinational logic for comparing said syndrome to columns of said parity matrix; and a controllable clock for generating clock signals for said hamming decoder.

10. An error-correction circuit according to claim 9 wherein said controllable clock comprises an asynchronous pulse generator for timing said hamming decoder.

11. An error-correction circuit according to claim 9 wherein said multiplier comprises a plurality of arrays of AND gates.

12. An error-correction circuit according to claim 11 wherein said multiplier further comprises a plurality of XOR trees.

13. An error-correction circuit according to claim 9 wherein said asynchronous pulse generator comprises a GasP pulse generator.

14. An error-correction circuit according to claim 9 wherein said asynchronous pulse generator comprises three GasP pulse generators connected in a ring.

15. An error-correction circuit for use in high speed semiconductor memory comprising:

a linear error-correcting decoder; said linear an error-correcting decoder comprising:

a first shift register for latching an input code word;

a ROM for storing a parity check matrix;

an address selector for said ROM; said address selector comprising a second shift register;

a multiplier for receiving an output of said first shift register and an output of said ROM and for outputting a syndrome; and combinational logic for comparing said syndrome to columns of said parity matrix; and an asynchronous pulse generator for timing said linear error-correcting decoder.

* * * * *